United States Patent [19]

Ishizuka et al.

[11] Patent Number: 4,976,624
[45] Date of Patent: Dec. 11, 1990

[54] IC SOCKET

[75] Inventors: Shinichi Ishizuka, Tachikawa; Takao Suzuki, Oume; Shoji Umesato; Yoshikatsu Okada, both of Tokyo, all of Japan

[73] Assignees: Japan Aviation Electronics Industry Limited; NEC Corporation, both of Tokyo, Japan

[21] Appl. No.: 466,564

[22] Filed: Jan. 17, 1990

[30] Foreign Application Priority Data

Jan. 19, 1989 [JP] Japan .................................. 1-5097[U]

[51] Int. Cl.$^5$ ........................... H01R 9/09; H05K 1/00
[52] U.S. Cl. ........................................ 439/70; 439/856
[58] Field of Search ..................... 439/70, 72, 81, 82, 439/856

[56] References Cited

U.S. PATENT DOCUMENTS 3,846,734  11/1974  Pauza et al. ............................. 439/70
4,682,829  7/1987  Kunkle et al. .......................... 439/70
4,857,001  8/1989  Nakano et al. ......................... 439/68

Primary Examiner—Paula A. Bradley
Attorney, Agent, or Firm—Pollock, Vande Sande and Priddy

[57] ABSTRACT

In an IC socket in which contactors are disposed along the inner wall surface of an insulating housing chamber into which a leg portion of an insulating cover is inserted, each contactor has one end portion bent in the direction of insertion of the leg portion to form a folded-back portion and has lugs which project out from both marginal edges of the contactor near the bent portion. In the inner wall surface of the chamber there are formed engaging recesses corresponding to the contactors. Each contactor is fixedly disposed with its bent portion held in contact with the inner wall surface of the chamber and with the lugs engaged with the engaging recesses in the inner wall surface of the chamber.

4 Claims, 4 Drawing Sheets

IC SOCKET

BACKGROUND OF THE INVENTION

The present invention relates to an IC socket for use in detachably mounting an IC (an integrated circuit) on a printed circuit board.

FIG. 1 shows a conventional IC socket of this kind, which is proposed in Japanese Utility Model Laid-Open Application No. 118449/89 (corresponding to U.S. patent application Ser. No. 301,098 filed on Jan. 25, 1989). As depicted in FIG. 1, the conventional IC socket is composed of an insulating cover 10 and a rectangular parallelepipedic insulating housing 20 which are separable from each other. The insulating cover 10 includes a square panel 12 having pin insertion holes 11 and two parallel leg portions 14, each having in its sides 14a pin guide grooves 13 which communicate with the pin insertion holes 11 of the panel 12. The insulating housing 20 has two parallel chambers 21 for receiving the leg portions 14 of the insulating cover 10. In the inner wall surface of each side wall 21a of each chamber 21 there are provided side by side at regular intervals contactor receiving recesses 21b which extend in the direction in which each leg portion 14 is inserted into the chamber 21, and contactors 30 disposed in the recesses 21b are arranged in two files.

Each contactor 30 has a pin contact portion 33 at one end near the open end portion of the chamber 21 and a terminal portion 36 at the other end, which projects out of the housing 20 through a slot 23 made in its bottom panel 21d as shown in FIG. 2 and is connected to a printed circuit board by a surface mounting method, though not shown. An IC 40 is mounted on the insulating cover 10 with terminal pins 41 of the IC inserted in the pin guide grooves 13 through the holes 11 of the cover, and the insulating cover 10 thus carrying the IC 40 is mounted on the insulating housing 20 with the leg portions 14 of the cover pressed into the chamber 21 of housing 20 so that the terminal pins 41 of the IC 40 are each held in contact with the corresponding contactor 30 at a required pressure.

In the conventional IC socket depicted in FIGS. 1 and 2 the terminal portion 36 of each contactor 30 has a lance 35 for preventing the contactor 30 from falling off the insulating housing 20. The slot 23 in the bottom panel 21d of the insulating housing 20 is formed a little larger than the thickness and the width of the terminal portion 36 having the lance 35 that the terminal portion 36 can pass through slot, and consequently, the contactor 30 disposed in the 21b has some play. Hence, if an external force is applied as by a touch with the hand, the contactor 30 will tilt away from the bottom of the recess 21b, and when the insulating cover 10 is mounted on the insulating housing 20, the tip of the leg portion 14 of the insulating cover 10 or the terminal pin 41 of the IC 40 will collide with the protruding tip of the contactor 30. In this instance, if the insulating cover 10 is mounted on the insulating housing 20 by force, then the contactor 30 will likely be buckled. In addition, the contact portion 33 of the contactor 30 is spaced apart from the inner wall surface of the side wall 21a of the chamber 21 so that the contact portion 30 may be elastically urged against the inner wall surface by the terminal pin 41 of the IC 40. Hence when the terminal pin 41 is bent, there is a risk that it will enter housing or between the contactor 30 and the inner wall of the chamber 21 and is buckled.

SUMMARY OF THE INVENTION

It is therefore an object of the present invention to provide an IC socket which includes an insulating cover and an insulating housing separable from each other and is free from the risk of the abovementioned buckling of contactors and terminal pins of an IC.

According to the present invention, engaging recesses are made in both sides of each contactor housing recess formed in the inner wall surface of each chamber of the insulating housing for receiving the leg portion of the insulating cover. One end portion of each contactor is bent and folded back in the direction in which the terminal pin of the IC is inserted. The contactor has lugs projecting out widthwise thereof at opposite sides near the bent portion and a pin contact portion formed at the end of the folded-back portion. The contactor is mounted in the insulating housing with the bent portion held in contact with the inner wall surface of the chamber and the lugs held in engagement with the engaging recesses.

With such a structure, since the lugs of each contactor are engaged with the engaging recesses made in both sides of the contactor housing recess of the insulating housing, even if the contactor is subjected to an external force as by a touch with the hand, it will not tilt, and hence will not be buckled when the insulating cover is mounted on the insulating housing.

Moreover, the bent portion of the contactor is held in direct contact with the inner wall surface of the chamber and the lugs of the contactor are engaged with the engaging recesses formed in both sides of the contactor housing recess of the insulating housing. This precludes the possibility of the terminal pin of the IC entering between the contactor and the inner wall surface of the chamber of the insulating housing and being buckled, even if the terminal pin is bent.

DESCRIPTION OF THE PREFERRED EMBODIMENTS

Figure 3:
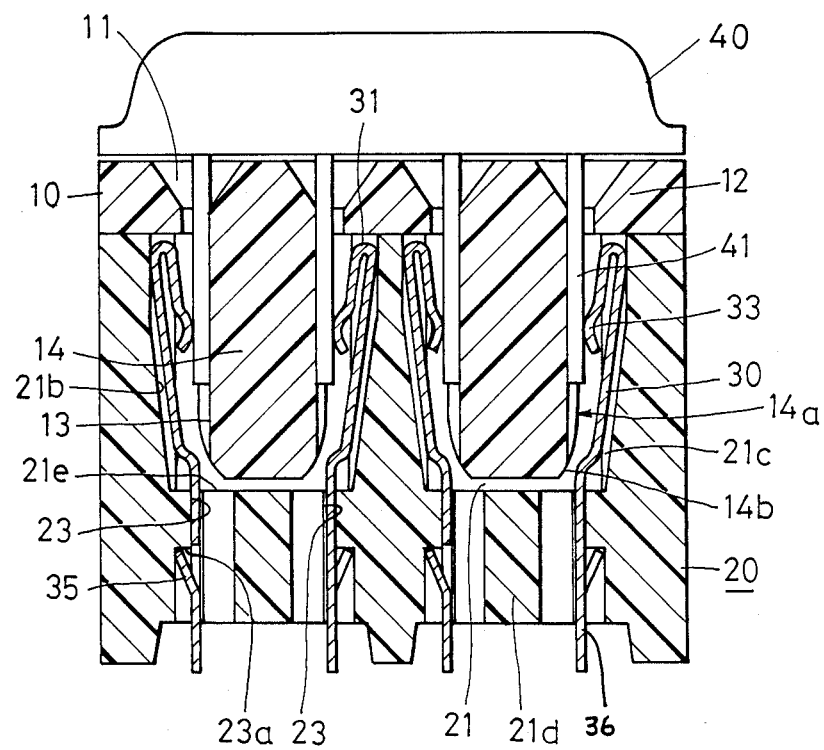
FIG. 3 is a sectional view showing an embodiment of the IC socket of the present invention with an IC mounted thereon.
Figure 4:
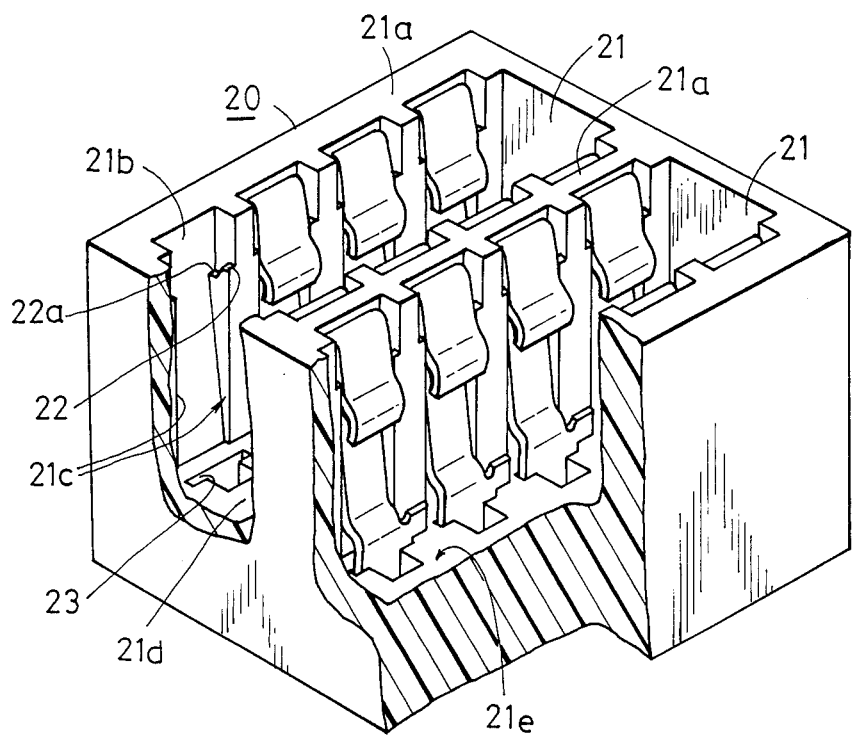
FIG. 4 is a perspective view, partly cut away, illustrating the insulating housing and contactors mounted therein.
Figure 5:
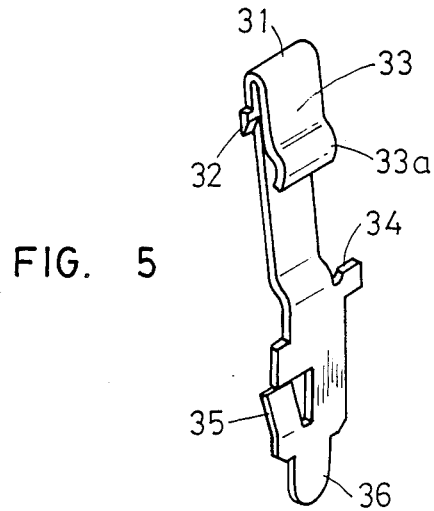
FIG. 5 is a perspective view illustrating a contactor for use in the present invention.

FIG. 3 illustrates in section an embodiment of the IC socket of the present invention with an IC mounted thereon, FIG. 4 is a sectional view, partly cut away, of the insulating housing having built therein contactors, and FIG. 5 is a perspective view of the contactor.

Figure 1:
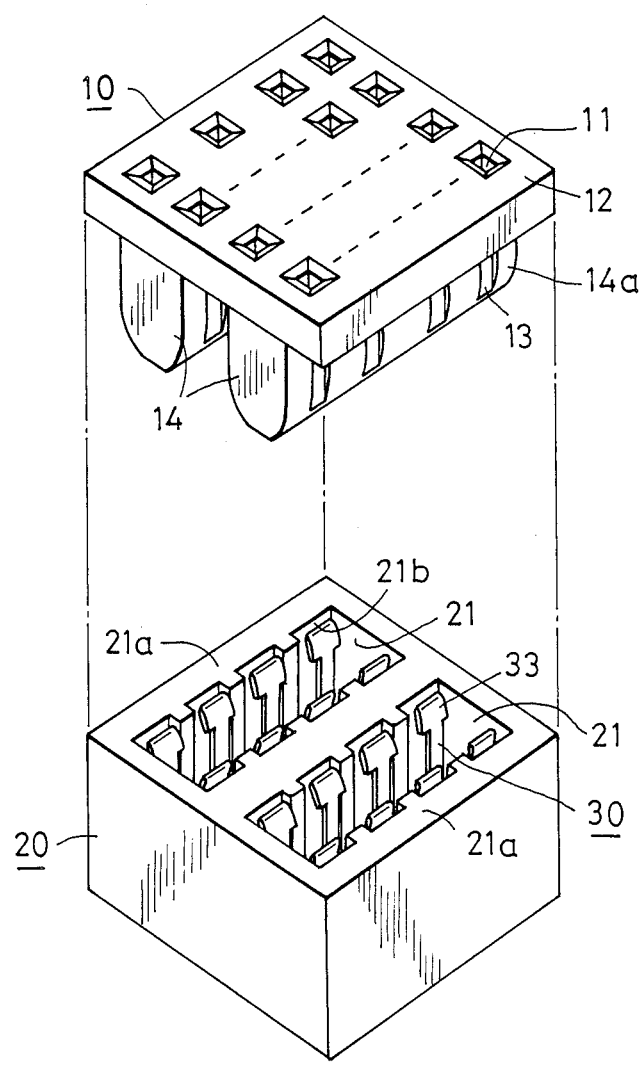
FIG. 1 a perspective view separately showing an insulating cover and an insulating housing which constitute a conventional IC socket.
Figure 2:
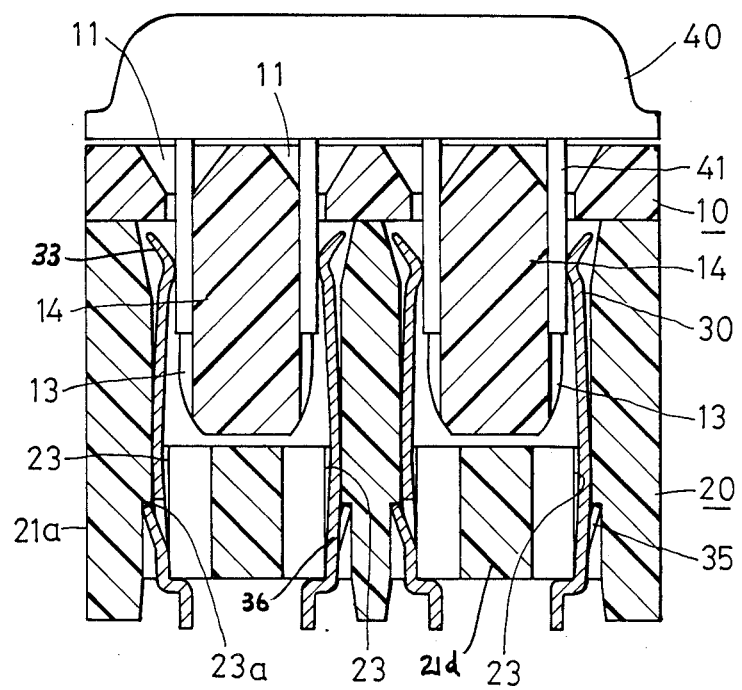
FIG. 2 is a sectional view showing the conventional IC socket with an IC mounted thereon.

The IC socket of the present invention comprises the insulating cover 10 and the insulating housing 20 which are separable from each other as is the case with the conventional IC socket shown in FIG. 1.

The insulating cover 10 is exactly the same as that depicted in FIG. 1 and includes the square panel 12 and the two parallel leg portions 14 formed integrally therewith on the underside thereof. The panel 12 has the pin insertion holes 11 arranged corresponding to the arrangement of the terminal pins 41 of the IC 40. The leg portions 14 each have in the opposite sides 14a thereof the pin guide grooves 13 which communicate with the pin insertion holes 11 of the panel 12. The lower end portions of the opposite sides 14a of each leg portion 14 are tapered as indicated by 14b.

The insulating housing 20 has the two narrow chambers 21 which are separated by the central wall 21a shown in FIG. 4, and into which the leg portions 14 of the insulating cover 10 are inserted. In the inner wall surface of each side wall 21a the contactor receiving recesses 21b, which extend in the direction of insertion of the leg portion 14 of the insulating cover 10 into the chamber 21, are formed at intervals in opposing relation to the guide grooves 13 of the leg portion 14. Each contactor receiving recess 21b has stepped portions 22 in both of its side walls 21c near the upper open end portion of the chamber 21 and each stepped portion 22 has an engaging recess 22a. The bottom panel 21d of the insulating housing 20 has the slots 23 for receiving the lower end portions of the contactors 30.

As shown in FIG. 5, each contactor 30 has its upper end portion folded back in the direction of insertion of the terminal pin 41 of the IC 40 and has lugs 32 projecting out from both of its side marginal edges near its bent portion 31 and a pin contact portion 33a formed at the end of its folded-back portion 33. When the leg portions 14 of the insulating cover 10 having mounted thereon the IC 40 are inserted into the chambers 21 of the insulating housing 40, each terminal 41 of the IC 40 presses the pin contact portion 33a of one of the contactors 30, elastically urging its folded-back portion 33 against the inner wall surface of the side wall 21a.

Each contactor 30 has a lock portion 34 projecting out from one marginal edge of its lower end portion and the lance 35 which projects out from the lower end portion of the contactor 30 but below the lock portion 34 and which extends in the direction reverse from that of insertion of the leg portion 14 and towards the inner wall surface of the side wall 21a. In the insulating housing 20 each contactor 30 is received in the receiving recess 21b with the bent portion held in contact with the inner wall surface of the side wall 21a, with the lugs 32 engaged with the engaging recesses 22a in the side walls 21c of the receiving recess 21b, with the lock portion 34 locked to the bottom surface 21e of the chamber 21 and with the lance 35 engaged with a stepped portion 23a formed in the slot 23. The terminal portions 36 of the contactors 30 thus mounted in the insulating housing 20 project out from the bottom panel 21d and are connected to a printed circuit board by a surface mounting method, though not shown.

The IC 40 is mounted on the insulating cover 10 with the terminal pins 41 inserted in the guide grooves 13 of the leg portions 14 through the holes 11 of the insulating cover 10, and the insulating cover 10 having thus mounted thereon the IC 40 is mounted on the insulating housing 20 attached to a printed circuit board, with the leg portions 14 received in the chambers 21 of the insulating housing 20, whereby the terminal pins 41 of the IC 40 can be brought into contact with the contactors 30 at a required contact pressure.

In this instance, the bent portion 31 of each contactor 30 disposed in the recess 21b is in close contact with the inner wall surface of the side wall 21a without any gap therebetween and this close contact of the bent portion 31 with the side wall 21a is maintained by the engagement of the lugs 32 of the contactor 30 with the engaging recesses 22a in the side surfaces 21c of the receiving recess 21b. Thus, there is no possibility of the terminal pin 41 entering between the contactor 30 and the side wall 21a of the chamber 21 and hence being buckled, even if the terminal pin 41 is bent.

Moreover, since the lugs 32 of the contactor 30 are engaged with the engaging recesses 22a in the side walls 21c of the recess 21b, the contactor 30 will not be tilted even if an external force is applied to the contactor 30 as by touching it with the hand before the insulating cover 10 is mounted on the insulating housing 20. Hence, the contactor 30 will not be buckled when the insulating cover 10 is mounted on the insulating housing 20.

While the present invention has been described in connection with the case where the insulating cover 10 has two leg portions 14 and consequently the insulating housing 20 has two chambers 21, it is evident that the insulating cover may have one or more than two leg portions and consequently the insulating housing may also have one or more than two chambers.

It is apparent that many modifications and variations may be effected without departing from the scope of the novel concepts of the present invention.

What is claimed is:

1. An IC socket comprising:
   an insulating cover comprising a panel having a plurality of pin insertion holes arranged in at least one row, and at least one leg portion formed integrally with said panel on the underside thereof and having in its sides grooves communicating with said pin insertion holes, respectively;
   an insulating housing having at least one open-ended chamber for receiving therein said leg portion of said insulating cover, said chamber having a bottom and an inner wall surface in which engaging recesses are formed; and
   a plurality of contractors arranged in said chamber, each of said contactors having a pair of opposed end portions, one end portion of each contactor being bent and folded back in the direction of insertion of said leg portion into said chamber to define a folded-back portion that is located in spaced relation to the bottom of said chamber, the other end portion of said contactor being held at the bottom of said chamber, each said contactor having lugs projecting outwardly form both marginal edges of said contactor near the bent portion thereof, and each said contactor also having a pin contact portion formed on said folded-back portion, said contactors being arranged along the inner wall surface of said chamber with said bent portion of each said contactor held in contact with said inner wall surface of said chamber, said lugs of each said contactor being engaged with said engaging recesses.

2. The IC socket of claim 1 wherein said inner wall surface of said chamber has formed therein receiving recesses for receiving said contactors, and said engaging recesses are formed in side walls of said receiving recesses.

3. The IC socket of claim 2 wherein each of said receiving recesses is widened near the open end of said chamber to form stepped portions in the side walls of said each receiving recess, and said engaging recesses are each formed in one of said stepped portions.

4. The IC socket of claim 1, 2, or 3 wherein said pin insertion holes are formed in four rows in said panel of said insulating cover, a second leg portion is formed integrally with said panel on the underside thereof in parallel to said leg portion, and said insulating housing has another chamber for receiving said second leg portion.

* * * * *